US011459411B2

(12) United States Patent
Sun et al.

(10) Patent No.: US 11,459,411 B2
(45) Date of Patent: *Oct. 4, 2022

(54) POLYOLEFIN COMPOSITION

(71) Applicant: Dow Global Technologies LLC, Midland, MI (US)

(72) Inventors: Yabin Sun, Shanghai (CN); Kainan Zhang, Shanghai (CN); Jeffrey M. Cogen, Flemington, NJ (US); Timothy J. Person, Pottstown, PA (US)

(73) Assignee: Dow Global Technologies LLC, Midland, MI (US)

( * ) Notice: Subject to any disclaimer, the term of this patent is extended or adjusted under 35 U.S.C. 154(b) by 278 days.

This patent is subject to a terminal disclaimer.

(21) Appl. No.: 16/620,030

(22) PCT Filed: Jun. 29, 2017

(86) PCT No.: PCT/CN2017/090770
§ 371 (c)(1),
(2) Date: Dec. 6, 2019

(87) PCT Pub. No.: WO2019/000311
PCT Pub. Date: Jan. 3, 2019

(65) Prior Publication Data
US 2020/0199340 A1 Jun. 25, 2020

(51) Int. Cl.
| | | |
|---|---|---|
| C08L 23/06 | (2006.01) | |
| C08L 23/04 | (2006.01) | |
| C08K 5/00 | (2006.01) | |
| C08F 110/02 | (2006.01) | |
| C09D 7/63 | (2018.01) | |
| C08K 5/14 | (2006.01) | |
| C09D 5/00 | (2006.01) | |
| C09D 123/26 | (2006.01) | |
| H01B 3/44 | (2006.01) | |
| C08F 10/02 | (2006.01) | |
| C08J 3/28 | (2006.01) | |
| H01B 13/00 | (2006.01) | |
| C08L 23/26 | (2006.01) | |
| H01B 7/282 | (2006.01) | |
| H01B 7/295 | (2006.01) | |

(52) U.S. Cl.
CPC ............ *C08F 110/02* (2013.01); *C08F 10/02* (2013.01); *C08J 3/28* (2013.01); *C08K 5/14* (2013.01); *C08L 23/26* (2013.01); *C09D 5/00* (2013.01); *C09D 7/63* (2018.01); *C09D 123/26* (2013.01); *H01B 3/441* (2013.01); *H01B 13/0016* (2013.01); *C08F 2810/20* (2013.01); *C08J 2323/06* (2013.01); *C08L 23/04* (2013.01); *C08L 23/06* (2013.01); *C08L 2023/44* (2013.01); *C08L 2205/025* (2013.01); *C08L 2207/066* (2013.01); *C08L 2312/08* (2013.01); *H01B 7/282* (2013.01); *H01B 7/295* (2013.01)

(58) Field of Classification Search
CPC ...... C08L 23/04; C08L 23/06; C08L 23/0807; C08L 23/16; C08L 2312/08; C08K 5/549
See application file for complete search history.

(56) References Cited

U.S. PATENT DOCUMENTS

| | | | |
|---|---|---|---|
| 3,859,247 A * | 1/1975 | MacKenzie, Jr. ..... | C08F 255/02 523/203 |
| 3,946,099 A | 3/1976 | MacKenzie, Jr. | |
| 4,005,254 A | 1/1977 | MacKenzie, Jr. | |
| 4,018,852 A | 4/1977 | Schober | |
| 4,255,303 A * | 3/1981 | Keogh ..................... | C08K 9/04 174/110 SR |
| 4,371,653 A * | 2/1983 | Betts ....................... | C08K 9/06 523/212 |
| 4,376,180 A | 3/1983 | Turbett et al. | |
| 5,246,783 A | 9/1993 | Spenadel et al. | |
| 5,346,961 A | 9/1994 | Shaw et al. | |
| 5,367,030 A | 11/1994 | Gau et al. | |
| 6,187,847 B1 | 2/2001 | Cogen et al. | |
| 6,191,230 B1 | 2/2001 | Keogh et al. | |
| 6,277,925 B1 | 8/2001 | Biswas et al. | |
| 6,404,971 B2 | 6/2002 | Mehl | |
| 6,496,629 B2 | 12/2002 | Ma et al. | |
| 6,714,707 B2 | 3/2004 | Rossi et al. | |
| 6,936,655 B2 | 3/2005 | Borke et al. | |
| 8,426,519 B2 * | 4/2013 | Cogen .................... | C08L 23/26 525/100 |
| 8,449,801 B2 | 5/2013 | Hsiao et al. | |
| 8,691,984 B2 | 4/2014 | Yamaura | |
| 9,147,784 B2 | 9/2015 | Shirahige et al. | |
| 9,670,351 B2 | 6/2017 | Siddhamalli et al. | |
| 2002/0198335 A1 | 12/2002 | Bernier et al. | |

(Continued)

FOREIGN PATENT DOCUMENTS

| | | |
|---|---|---|
| CA | 2732755 | 2/2010 |
| CN | 1803907 | 7/2006 |

(Continued)

OTHER PUBLICATIONS

CN 105175887 A (Dec. 23, 2015); machine translation. (Year: 2015).*
Liu Gang, et al., Study on cyclosiloxane containing vinylphenyl as crosslinking agent in polypropylene, New Chemical Materials, Oct. 31, 2006, No. 10, vol. 34, pp. 78-80.
F.O. Stark et al., Silicones, Comprehensive Organometallic Chemistry, vol. 2, 305, Pergamon Press (1982).
Introduction to Polymer Chemistry, Stille, Wiley and Sons, New York, 1962, pp. 149 to 151.

(Continued)

*Primary Examiner* — Rip A Lee

(57) ABSTRACT

A polyolefin composition comprising a polyolefin polymer and an alkenyl-functional monocyclic organosiloxane, products made therefrom, methods of making and using same, and articles containing same.

10 Claims, No Drawings

(56) References Cited

U.S. PATENT DOCUMENTS

| | | | |
|---|---|---|---|
| 2003/0166817 A1 | 9/2003 | Degussa | |
| 2008/0176981 A1 | 7/2008 | Biscoglio et al. | |
| 2015/0376386 A1 | 12/2015 | Kim et al. | |
| 2020/0199270 A1* | 6/2020 | Zhang | H01B 3/441 |

FOREIGN PATENT DOCUMENTS

| | | | |
|---|---|---|---|
| CN | 101104706 | 1/2008 | |
| CN | 102838827 | 12/2012 | |
| CN | 103360712 | 10/2013 | |
| CN | 103865420 | 6/2014 | |
| CN | 104277182 | 1/2015 | |
| CN | 104610634 | 5/2015 | |
| CN | 104877171 | 9/2015 | |
| CN | 105175887 A * | 12/2015 | C08L 23/12 |
| CN | 106674999 | 5/2017 | |
| DE | 2001205 | 7/1970 | |
| DE | 102006017346 | 10/2007 | |
| EP | 0856542 A1 | 8/1998 | |
| EP | 1433811 | 6/2004 | |
| EP | 2889323 | 7/2015 | |
| ES | 373818 | 2/1972 | |
| FR | 2033903 | 12/1970 | |
| GB | 1277378 * | 6/1972 | C08F 45/04 |
| JP | 48024492 | 7/1973 | |
| JP | 11060748 | 3/1999 | |
| NL | 7001224 | 8/1970 | |
| SE | 368579 | 7/1974 | |
| WO | 1996039459 | 12/1996 | |
| WO | 2015149221 | 10/2015 | |
| WO | 2016187755 | 12/2016 | |

OTHER PUBLICATIONS

J, Wu., et al.,, Crosslinking of low density polyethylene with Octavinyl polyhedral oligomeric silsesquioxane as the crosslinker, RSC Advances, 2014, vol. 4, p. 44030.

Li, P., A brief product introduction of the organic modified siloxane and applications, Evonik Industries, Nov. 2014.

Wiley Periodicals, Inc. Engineering properties of electron beam-crosslinked ethylene methyl acrylate copolymer. J Appl Polym Sci, 2010.

Pentavinylpentamethylcyclopentasiloxane, 95%, Gelest, Inc., p. 1-6, vol. 77, No. 58, Dec. 4, 2014.

Reactive Silicones: Forging New Polymer Links, Gelest, Inc., p. 13, 2013.

* cited by examiner

POLYOLEFIN COMPOSITION

FIELD

The field includes polyolefin compositions, products made therefrom, methods of making and using same, and articles containing same.

INTRODUCTION

Polyolefins are used in a number of commercial applications. These include coatings, films, sheets, and injection molded articles. Coatings may be used on wire and cables for electric power transmitting and telecommunications applications. Films and sheets are used in packaging applications and non-packaging applications. Examples are agricultural film, food packaging, garment bags, grocery bags, heavy-duty sacks, industrial sheeting, pallet and shrink wraps, and bags. LLDPE injection molded articles include buckets, freezer containers, lids, toys.

U.S. Pat. No. 4,005,254 to B. T. MacKenzie, Jr. ("MacKenzie") relates to a pressureless cure system for chemically cross-linking ethylene containing polymers, and product formed thereby.

A curable composition comprises an ethylene-containing polymer, a curing agent, and a mineral filler treated with tetramethyltetravinylcyclotetrasiloxane. In preparing the composition, the polymer, mineral filler, tetramethyltetravinylcyclotetrasiloxane, and other additives are intimately admixed as in a Banbury. During this compounding operation, the tetramethyltetravinylcyclotetrasiloxane is said to interact or coat the filler, and the result is referred to as siloxane treated filler. Where desired, the mineral filler may be pretreated with the tetramethyltetravinylcyclotetrasiloxane in a separate operation, and the siloxane treated filler is then admixed with the polymer and other additives. MacKenzie's Toluene Extract (% on compound) data for Example 1 (0.0 weight percent (wt %) tetramethyltetravinylcyclotetrasiloxane) is 11.6% and for Examples 2 and 3 (each 0.97 wt % tetramethyltetravinylcyclotetrasiloxane based on total composition weight) are 9.6% and 11.8%, respectively (Table I). In view of the percent extractables for comparative Example 1 relative to those for Examples 2 and 3, it would be recognized by a skilled artisan that the tetramethyltetravinylcyclotetrasiloxane in Examples 2 and 3 did not contribute to crosslinking of the ethylene-containing polymer. Instead the tetramethyltetravinylcyclotetrasiloxane coated the aluminum silicate filler, as taught by MacKenzie.

U.S. Pat. No. 8,426,519 B2 to J. M. Cogen, et al. relates to silicone-thermoplastic polymer reactive blends and copolymer products prepared using economical post-reactor reactive mixing, e.g., extrusion. The procedure is based on the ring-opening polymerization of cyclic siloxanes within a thermoplastic polymer matrix. In a preferred mode, the thermoplastic polymer is a polyolefin, optionally containing silane groups that are available for reaction with the silicone polymer that is formed in situ. The resulting materials provide hybrid performance that can extend the range of applications beyond those which are served by thermoplastic polymers or silicones alone, or their physical blends.

CN104277182A to Z-I Wu et al., and the article Crosslinking of low density polyethylene with Octavinyl polyhedral oligomeric silsesquioxane as the crosslinker, J. Wu., et al., RSC Advances, 2014, volume 4, page 44030, relate to a method of preparing a crosslinked low density polyethylene using an octavinyl polyhedral oligomeric silsesquioxane as a crosslinker.

SUMMARY

We recognized a problem that hurts the crosslinking and performance of prior polyolefins. Coagents may be blended with polyolefins to give polyolefin compositions with increased crosslinking capability, but conventional coagents have their limitations. For example, a conventional coagent typically has limited solubility or miscibility in polyolefin compositions. This limits the coagent's maximum loading level in the composition. It also causes the coagent to undesirably migrate to the surface of the composition (e.g., surface of pellets), limiting the composition's storage lifetime. Conventional coagents also pose other problems. For example, upon curing they may yield crosslinked products with insufficient extent of crosslinking. Or the compositions may cure too slowly for use in certain manufacturing operations (e.g., power cable manufacturing, injection molding, and film extrusion). Or the compositions may cure prematurely (i.e., to be prone to scorch during cable extrusion, injection molding, and film extrusion). Not surprisingly, these problems have limited the structures of conventional coagents that have been used with polyolefins. Typically, conventional coagents comprise conventional substructural groups bonded to two or more olefinic cross-linking groups. The conventional substructural groups are acyclic or cyclic multivalent groups that comprise a backbone or ring, respectively, containing in the backbone or ring carbon atoms and, optionally, nitrogen and/or oxygen atoms, but not silicon atoms.

A technical solution to this problem was not obvious from the prior art. A problem to be solved by inventiveness then is to discover a new polyolefin composition comprising a polyolefin polymer and an improved coagent. Our analysis suggests that the new coagent ideally would be a cyclic molecule that does not contain carbon or nitrogen atoms in its ring.

Our technical solution to this problem includes a polyolefin composition comprising a polyolefin polymer and an alkenyl-functional monocyclic organosiloxane; crosslinked polyolefin products made therefrom; methods of making and using same; and articles containing same.

The inventive polyolefin composition and products are useful in any application in which polyolefins, including crosslinked polyolefins, are utilized, including coatings, films, sheets and injection molded articles.

DETAILED DESCRIPTION

The Summary and Abstract are incorporated here by reference.

The inventive polyolefin composition containing the polyolefin polymer and the alkenyl-functional monocyclic organosiloxane may be cured (crosslinked) via irradiation or an organic peroxide without ring opening of the alkenyl-functional monocyclic organosiloxane. The curing reaction is conducted in such a way that the alkenyl-functional monocyclic organosiloxane does not give a polymerized siloxane (silicone polymer). Without being bound by theory it is believed that the constituents of the polyolefin composition are chosen such that during curing of the polyolefin composition the alkenyl-functional monocyclic organosiloxane does not ring-open to give a ring-opened silanol (S—OH)-functional organosiloxane oligomer (linear or branched), and therefore the polymerized siloxane (silicone polymer) is not formed in situ within the polyolefin polymer. The alkenyl-functional monocyclic organosiloxane cannot undergo ring-opening at least in part because the polyolefin composition does not contain, and thus because the curing reaction is conducted in the absence of, a ring opening catalyst. The excluded ring-opening catalysts are known and include a phosphazene base. The phosphazene base has a core structure P=N, in which free N valencies are linked to hydrogen, hydrocarbyl, —P=N or =P—N, and free P valencies are linked to =N or —N. Examples of phosphazene bases are found in U.S. Pat. No. 8,426,519 B2, column 9, line 29, to column 10, line 31. Other types of ring opening catalysts, which are excluded from the polyolefin composition and hence from the crosslinked polyolefin product prepared therefrom, are known. For examples, see F. O. Stark et al., Silicones, Comprehensive Organometallic Chemistry, volume 2, 305, Pergamon Press (1982). Examples are strong acids such as trifluoromethanesulfonic acid and its metal salts, sulfuric acid, perchloric acid, and hydrochloric acid; cationic ring opening catalysts such as metal halides; and anionic ring opening catalysts such as organolithiums, alkali metal oxides, and alkali metal hydroxides. In the absence of the ring opening catalyst, the inventive polyolefin composition undergoes crosslinking of the alkenyl-functional monocyclic organosiloxane to the polyolefin polymer via free-radical curing to form the crosslinked polyolefin product. The crosslinking beneficially occurs without ring opening of the alkenyl-functional monocyclic organosiloxane even in the presence of ambient moisture.

Unpredictably, the inventive polyolefin composition containing the alkenyl-functional monocyclic organosiloxane, or the inventive crosslinked polyolefin product prepared therefrom, has at least one improved property relative to a comparative polyolefin composition that contains either a linear vinyl methoxysiloxane homopolymer (oligomer), vinyl, methylsiloxane homopolymer (oligomer), or a cage-like vinyl functional silsesquioxane, or product prepared therefrom, respectively. The improved property may be a shorter time period to achieve 90% crosslinking ("T90") in the crosslinked polyolefin product, as measured by the T90 Crosslinking Time Test Method described later, which indicates a beneficially faster curing rate; a greater maximum torque value ("MH"), as measured by the T90 Crosslinking Time Test Method, which indicates a beneficially greater extent of crosslinking in the crosslinked polyolefin product; an increased time to scorch ("ts1") at 140° C., as measured by the Scorch Time Test Method described later, which indicates a beneficially increased resistance to premature curing of the polyolefin composition during extrusion (e.g., curing in an extruder instead of in a post-extruder operation); and/or an ability of the alkenyl-functional monocyclic organosiloxane to be loaded into the polyolefin polymer at greater concentrations without "sweat out" of the alkenyl-functional monocyclic organosiloxane, compared to what is possible with loading conventional coagents in the polyolefin polymer. The "sweat out" is as determined by the Migration Measurement Test Method or the Surface Migration Test Method described later, during storage of the polyolefin composition over a period of time, which indicates greater compatibility and/or solubility of the alkenyl-functional monocyclic organosiloxane (as a silicon-based coagent) in the polyolefin polymer of the polyolefin composition.

In aspects wherein the inventive polyolefin composition further contains an organic peroxide as cure agent, the resulting inventive crosslinked polyolefin product made by curing same may be characterized by a greater extent of crosslinking (a greater number of crosslinks) than could be achieved in a comparative crosslinked polyolefin product made by curing a comparative polyolefin composition that contains polyolefin and organic peroxide but which is free of the alkenyl-functional monocyclic organosiloxane. The resulting inventive crosslinked polyolefin product may have a greater extent of crosslinking than could be achieved using a conventional coagent in place of the alkenyl-functional monocyclic organosiloxane. The polyolefin composition may have a longer shelf life without experiencing "sweat out", perhaps due to higher solubility of the alkenyl-functional monocyclic organosiloxane in the polyolefin polymer than that of the conventional coagent in polyolefin polymer. The inventive polyolefin composition may have a shorter T90 crosslinking time (faster crosslinking) than could be achieved using a conventional coagent in place of the alkenyl-functional monocyclic organosiloxane. The inventive crosslinked polyolefin product may have greater resistance to scorch (e.g., ts1 at 140° C.) compared to the comparative crosslinked polyolefin product when the latter is formulated to have the same number of crosslinks as the former.

Certain inventive embodiments are described below as numbered aspects for easy cross-referencing. Additional embodiments are described elsewhere herein.

Aspect 1. A polyolefin composition comprising (A) a polyolefin polymer and a crosslinking effective amount of (B) a monocyclic organosiloxane of formula (I): $[R^1, R^2SiO_{2/2}]n$ (I), wherein subscript n is an integer greater than or equal to 3; each $R^1$ is independently a $(C_2-C_4)$alkenyl or a $H_2C=C(R^{1a})-C(=O)-O-(CH_2)_m-$ wherein $R^{1a}$ is H or methyl and subscript m is an integer from 1 to 4; and each $R^2$ is independently H, $(C_1-C_4)$alkyl, phenyl, or $R^1$; with the proviso that the polyolefin composition is free of (i.e., lacks) a phosphazene base. In some aspects the polyolefin composition is free of any ring opening catalyst. In some aspects when the polyolefin polymer is an ethylene-containing polymer and subscript n is 4, the polyolefin composition does not contain 24 wt % or more of, alternatively does not contain 22 wt % or more of, alternatively does not contain 20.0 wt % or more of, alternatively does not contain 15 wt % or more of, alternatively does not contain 10 wt % or more of, alternatively is free of an inorganic filler selected from the group consisting of aluminum oxide, aluminum silicate, calcium silicate, magnesium silicate, silica, titanium dioxide, and mixtures thereof. In some aspects n is 3, 4, 5, or 6; alternatively 3, 4, or 5; alternatively 5 or 6; alternatively 3 or 4; alternatively 3; alternatively 4; alternatively 5; alternatively 6.

Aspect 2. A polyolefin composition comprising (A) a polyolefin polymer and (B) a monocyclic organosiloxane of formula (I): $[R^1,R^2SiO_{2/2}]_n$ (I), wherein subscript n is an integer greater than or equal to 3; each $R^1$ is independently a $(C_2-C_4)$alkenyl or a $H_2C=C(R^{1a})-C(=O)-O-(CH_2)_m-$ wherein $R^{1a}$ is H or methyl and subscript m is an integer from 1 to 4; and each $R^2$ is independently H, $(C_1-C_4)$alkyl, phenyl, or $R^1$; with the proviso that when the (A) polyolefin polymer is an ethylene-containing polymer and subscript n is 4, the polyolefin composition does not contain 24 wt % or more of, alternatively does not contain 22 wt % or more of, alternatively does not contain 20.0 wt % or more of, alternatively does not contain 15 wt % or more of, alternatively does not contain 10 wt % or more of, alternatively is free of an inorganic filler selected from the group consisting of aluminum oxide, aluminum silicate, calcium silicate, magnesium silicate, silica, titanium dioxide, and mixtures thereof; and with the proviso that the polyolefin composition is free of a phosphazene base. In some aspects the polyolefin composition is free of any ring opening catalyst. In some aspects n is 3, 4, 5, or 6; alternatively 3, 4, or 5; alternatively 5 or 6; alternatively 3 or 4; alternatively 3; alternatively 4; alternatively 5; alternatively 6.

Aspect 3. The polyolefin composition of aspect 1 or 2 wherein subscript n is 3 and the (B) monocyclic organosiloxane of formula (I) is described by any one of limitations (i) to (x): (i) each $R^1$ is independently a $(C_2-C_3)$alkyl; and each $R^2$ is independently H, $(C_1-C_2)$alkyl, or $(C_2-C_3)$alkenyl; (ii) each $R^1$ is vinyl; and each $R^2$ is independently $(C_1-C_2)$alkyl; (iii) each $R^1$ is vinyl; and each $R^2$ is methyl; (iv) each $R^1$ is allyl; and each $R^2$ is independently $(C_1-C_2)$alkyl; (v) each $R^1$ is allyl; and each $R^2$ is methyl; (vi) each $R^1$ is independently $H_2C\!=\!C(R^{1a})\!-\!C(\!=\!O)\!-\!O\!-\!(CH_2)_m\!-$ wherein $R^{1a}$ is H or methyl and subscript m is an integer from 1 to 4; and each $R^2$ is independently H, $(C_1-C_2)$alkyl, or $(C_2-C_3)$alkenyl; (vii) each $R^1$ is independently $H_2C\!=\!C(R^{1a})\!-\!C(\!=\!O)\!-\!O\!-\!(CH_2)_m\!-$ wherein $R^{1a}$ is H and subscript m is 3; and each $R^2$ is independently $(C_1-C_2)$alkyl; (viii) each $R^1$ is independently $H_2C\!=\!C(R^{1a})\!-\!C(\!=\!O)\!-\!O\!-\!(CH_2)_m\!-$ wherein $R^{1a}$ is methyl and subscript m is 3; and each $R^2$ is independently $(C_1-C_2)$alkyl; (ix) the polyolefin composition does not contain 24 wt % or more of, alternatively does not contain 22 wt % or more of, alternatively does not contain 20.0 wt % or more of, alternatively does not contain 15 wt % or more of, alternatively does not contain 10 wt % or more of, alternatively is free of an inorganic filler selected from the group consisting of aluminum oxide, aluminum silicate, calcium silicate, magnesium silicate, silica, titanium dioxide, and mixtures thereof; and (x) a combination of limitation (ix) and any one of limitations (i) to (viii).

Aspect 4. The polyolefin composition of aspect 1 or 2 wherein subscript n is 4 and the (B) monocyclic organosiloxane of formula (I) is described by any one of limitations (i) to (x): (i) each $R^1$ is independently a $(C_2-C_3)$alkyl; and each $R^2$ is independently H, $(C_1-C_2)$alkyl, or $(C_2-C_3)$alkenyl; (ii) each $R^1$ is vinyl; and each $R^2$ is independently $(C_1-C_2)$alkyl; (iii) each $R^1$ is vinyl; and each $R^2$ is methyl; (iv) each $R^1$ is allyl; and each $R^2$ is independently $(C_1-C_2)$alkyl; (v) each $R^1$ is allyl; and each $R^2$ is methyl; (vi) each $R^1$ is independently $H_2C\!=\!C(R^{1a})\!-\!C(\!=\!O)\!-\!O\!-\!(CH_2)_m\!-$ wherein $R^{1a}$ is H or methyl and subscript m is an integer from 1 to 4; and each $R^2$ is independently H, $(C_1-C_2)$alkyl, or $(C_2-C_3)$alkenyl; (vii) each $R^1$ is independently $H_2C\!=\!C(R^{1a})\!-\!C(\!=\!O)\!-\!O\!-\!(CH_2)_m\!-$ wherein $R^{1a}$ is H and subscript m is 3; and each $R^2$ is independently $(C_1-C_2)$alkyl; (viii) each $R^1$ is independently $H_2C\!=\!C(R^{1a})\!-\!C(\!=\!O)\!-\!O\!-\!(CH_2)_m\!-$ wherein $R^{1a}$ is methyl and subscript m is 3; and each $R^2$ is independently $(C_1-C_2)$alkyl; (ix) the polyolefin composition does not contain 24 wt % or more of, alternatively does not contain 22 wt % or more of, alternatively does not contain 20.0 wt % or more of, alternatively does not contain 15 wt % or more of, alternatively does not contain 10 wt % or more of, alternatively is free of any inorganic filler; and (x) a combination of limitation (ix) and any one of limitations (i) to (viii).

Aspect 5. The polyolefin composition of aspect 1 or 2 wherein subscript n is 5 or 6 and the (B) monocyclic organosiloxane of formula (I) is described by any one of limitations (i) to (x): (i) each $R^1$ is independently a $(C_2-C_3)$alkenyl; and each $R^2$ is independently H, $(C_1-C_2)$alkyl, or $(C_2-C_3)$alkenyl; (ii) each $R^1$ is vinyl; and each $R^2$ is independently $(C_1-C_2)$alkyl; (iii) each $R^1$ is vinyl; and each $R^2$ is methyl; (iv) each $R^1$ is allyl; and each $R^2$ is independently $(C_1-C_2)$alkyl; (v) each $R^1$ is allyl; and each $R^2$ is methyl; (vi) each $R^1$ is independently $H_2C\!=\!C(R^{1a})\!-\!C(\!=\!O)\!-\!O\!-\!(CH_2)_m\!-$ wherein $R^{1a}$ is H or methyl and subscript m is an integer from 1 to 4; and each $R^2$ is independently H, $(C_1-C_2)$alkyl, or $(C_2-C_3)$alkenyl; (vii) each $R^1$ is independently $H_2C\!=\!C(R^{1a})\!-\!C(\!=\!O)\!-\!O\!-\!(CH_2)_m\!-$ wherein $R^{1a}$ is H and subscript m is 3; and each $R^2$ is independently $(C_1-C_2)$alkyl; (viii) each $R^1$ is independently $H_2C\!=\!C(R^{1a})\!-\!C(\!=\!O)\!-\!O\!-\!(CH_2)_m\!-$ wherein $R^{1a}$ is methyl and subscript m is 3; and each $R^2$ is independently $(C_1-C_2)$alkyl; (ix) the polyolefin composition does not contain 24 wt % or more of, alternatively does not contain 22 wt % or more of, alternatively does not contain 20.0 wt % or more of, alternatively does not contain 15 wt % or more of, alternatively does not contain 10 wt % or more of, alternatively is free of an inorganic filler selected from the group consisting of aluminum oxide, aluminum silicate, calcium silicate, magnesium silicate, silica, titanium dioxide, and mixtures thereof; and (x) a combination of limitation (ix) and any one of limitations (i) to (viii).

Aspect 6. The polyolefin composition of any one of aspects 1 to 5 wherein the (A) polyolefin polymer is described by any one of limitations (i) to (vi): (i) the (A) polyolefin polymer is a polyethylene polymer comprising 50 to 100 weight percent (wt %) ethylenic monomeric units, 50 to 0 wt % $(C_3-C_{20})$alpha-olefin-derived comonomeric units, and 20 to 0 wt % diene comonomeric units, wherein total weight percent is 100.00 wt %; (ii) the (A) polyolefin polymer is a polypropylene polymer comprising 50 to 100 weight percent (wt %) propylenic monomeric units and 50 to 0 wt % of ethylenic or $(C_4-C_{20})$alpha-olefin-derived comonomeric units and optionally 20 to 0 wt % dienic comonomeric units; (iii) the (A) polyolefin polymer is an ethylene/vinyl acetate (EVA) copolymer comprising 50 to <100 wt % ethylenic monomeric units and 50 to >0 wt % vinyl acetate-derived comonomeric units; (iv) the (A) polyolefin polymer is an ethylene/alkyl (meth)acrylate (EAA) copolymer comprising 50 to <100 wt % ethylenic monomeric units and 50 to >0 wt % alkyl (meth)acrylate-derived comonomeric units; (v) the (A) polyolefin polymer is an acrylate-terminated oligomer or polymer (not an EAA polymer); (v) the (A) polyolefin polymer is free of ethylenic units; (vi) the (A) polyolefin polymer is an ethylene/maleic anhydride copolymer comprising 50 to <100 wt % ethylene monomeric units and 50 to >0 wt % maleic anhydride comonomeric units; (vii) the (A) polyolefin polymer is an ethylene/alkenyl silane copolymer comprising from 50 to <100 wt % ethylene monomeric units and from 50 to >0 wt % alkenylsilane comonomeric units; (viii) the (A) polyolefin polymer is an alkenyl-terminated organosiloxane oligomer; (ix) the (A) polyolefin polymer is an ethylene/multi-comonomers copolymer, the multi-comonomers are at least two of $(C_3-C_{20})$alpha-olefin, diene, vinyl acetate, alkyl (meth)acrylate, maleic anhydride, alkenyl silane, and alkenyl-terminated organosiloxane oligomer; (x) the (A) polyolefin polymer is selected from natural rubber, nitrile rubber, chlorosulfonated polyethylene (CSM), chlorinated polyethyl (CPE), neoprene rubber, and butyl rubber; and (xi) the (A) polyolefin polymer is a combination or blend of any two of (i) to (x).

Aspect 7. The polyolefin composition of aspect 6 wherein the $(C_3-C_{20})$alpha-olefin-derived comonomeric units and/or $(C_4-C_{20})$alpha-olefin-derived comonomeric units are derived from 1-butene, 1-hexene, 1-octene, or a combination of any two thereof; alternatively 1-butene; alternatively 1-hexene; alternatively 1-octene; alternatively a combination of any two of, alternatively each of 1-butene, 1-hexene, and 1-octene.

Aspect 8. The polyolefin composition of any one of aspects 1 to 7 further comprising at least one additive selected from the group consisting of: (C) an organic peroxide; (D) a conventional coagent; (E) an antioxidant; (F) a filler; (G) a flame retardant; (H) a hindered amine stabilizer; (I) a tree retardant; (J) a methyl radical scavenger; (K) a scorch retardant, (L) a nucleating agent, and (M) carbon black; with the proviso that the total amount of the at least one additive is from >0 to 70 wt %, alternatively from >0 to 60 wt %, alternatively from >0 to 40 wt %, alternatively from >0 to 20 wt % of the polyolefin composition and with the proviso that the (F) filler does not include any omitted filler. In some aspects the polyolefin composition further comprises the (C) organic peroxide and, optionally, the (E) antioxidant; alternatively the (E) antioxidant and, optionally, the (C) organic peroxide; alternatively the (C) organic peroxide, (E) antioxidant, and, optionally, the (H) hindered amine stabilizer.

Aspect 9. A method of making a polyolefin composition, the method comprising mixing (A) a polyolefin polymer and (B) a monocyclic organosiloxane of formula (I): $[R^1, R^2SiO_{2/2}]_n$ (I) together to make the polyolefin composition of any one of aspects 1 to 7. The subscript n and groups $R^1$ and $R^2$ are as defined in any one of aspects 1 to 5. The (A) polyolefin polymer is as defined in any one of aspects 1, 2, 6 and 7. The method may further comprise mixing at least one of the additives defined in aspect 8 with the constituents (A) and (B) to make the polyolefin composition of aspect 8.

Aspect 10. A method of free-radical curing a polyolefin composition comprising (A) a polyolefin polymer and a crosslinking effective amount of a (B) a monocyclic organosiloxane of formula (I): $[R^1, R^2SiO_{2/2}]_n$ (I), wherein subscript n is 3, 4, 5, or 6; each $R^1$ is independently a $(C_2-C_4)$alkenyl; and each $R^2$ is independently H, $(C_1-C_4)$ alkyl, $(C_2-C_4)$alkenyl, or phenyl to make a crosslinked polyolefin product, the method comprising irradiating the polyolefin composition with a curing effective dose of irradiation and/or heating the polyolefin composition at a curing effective temperature with (C) an organic peroxide in such a way so as to react the (A) polyolefin polymer with the (B) monocyclic organosiloxane of formula (I), thereby making a crosslinked polyolefin product. In some aspects the polyolefin composition and crosslinked polyolefin product are free of a phosphazene base, alternatively any ring-opening catalyst. In some aspects the polyolefin composition is the polyolefin composition of any one of aspects 1 to 8. In some aspects the method is irradiating, optionally with (C) an organic peroxide; alternatively the method is heating with (C) organic peroxide. The combination of the crosslinking effective amount of (B) with the curing effective dose of irradiation or the curing effective temperature, and any other desired reaction conditions (e.g., pressure or inert gas atmosphere) is sufficient to cure the polyolefin composition and make the crosslinked polyolefin product under the circumstances. The source of irradiation may be an electron beam, gamma radiation, ultraviolet (UV) light, or a combination of any two or more thereof.

Aspect 11. A crosslinked polyolefin product made by the method of curing of aspect 10.

Aspect 12. A manufactured article comprising a shaped form of the polyolefin composition of any one of aspects 1 to 8 or the crosslinked polyolefin product of aspect 11. In some aspects the manufactured article is selected from: coatings, films, sheets, and injection molded articles. E.g., coatings of wire and cables for transmitting electric power or telecommunications, agricultural film, food packaging, garment bags, grocery bags, heavy-duty sacks, industrial sheeting, pallet and shrink wraps, bags, buckets, freezer containers, lids, toys.

The term "coagent" means a compound that enhances crosslinking, i.e., a curing coagent. "Conventional coagent" is an acyclic or cyclic compound that enhances crosslinking and contains carbon atoms in its respective backbone or ring substructure. Thus, the backbone or ring substructure of the conventional coagent is based on carbon (carbon-based substructure). In contrast a silicon-based coagent means an acyclic or cyclic compound that enhances crosslinking and that contains silicon atoms in its respective backbone or ring substructure. The (B) monocyclic organosiloxane of formula (I) is a cyclic silicon-based coagent.

The terms "curing" and "crosslinking" are used interchangeably herein to mean forming a crosslinked product (network polymer) without ring opening polymerization.

The term "ethylene-containing polymer" means a macromolecule containing repeat units derived from $H_2C=CH_2$.

The term "(meth)acrylate" includes acrylate, methacrylate, and a combination thereof. The (meth)acrylate may be unsubstituted.

The term "ring opening catalyst" as used herein means a substance that initiates a ring opening polymerization reaction, and/or enhances the rate of a ring opening polymerization reaction, of a cyclic siloxane monomer.

The term "ring opening polymerization" as used herein is a type of chain growth polymerization reaction wherein a reactive end of a polymer chain opens the ring of a cyclic monomer to give a longer polymer chain.

The polyolefin composition: a single phase or multiphase, uniform or non-uniform, continuous phase or discontinuous phase, crosslinkable material containing macromolecules composed of repeat units derived from one or more monomers containing carbon-carbon double bonds and molecules of an alkenyl-functional monocyclic organosiloxane. In some aspects the polyolefin composition may further contain one, two, or more optional ingredients or additives. The total weight of the polyolefin composition is 100.00 wt %.

The polyolefin composition may be made by a number of different ways. In some aspects the polyolefin composition may be made by mixing a melt of the (A) polyolefin polymer with the (B) monocyclic organosiloxane of formula (I) and any optional constituents (e.g., any zero, one or more of constituents (C) to (M) to give the polyolefin composition as an admixture of constituents (A), (B), and the any optional constituents. The mixing may comprise compounding, kneading, or extruding. To facilitate mixing one or more constituents (e.g., (B), additives (C), (D), (E), and etc.) may be provided in the form of an additive masterbatch in a portion of (A).

In another aspect, the polyolefin composition may be made by contacting the (B) monocyclic organosiloxane of formula (I), and optionally zero, one or more of any optional constituents (e.g., (C) organic peroxide), with an unmelted form of the (A) polyolefin polymer to give the polyolefin composition as an admixture of constituents (A), (B), and the any optional constituents. The contacting may comprise soaking, imbibing or injecting. Constituent (B) and any optional constituent(s) independently may be combined by compounding, extruding, imbibing, injecting, kneading, or soaking. The mixing or contacting may be carried out at a temperature from about 20° to 100° C. for 0.1 to 100 hours, e.g., 60° to 80° C. for 0.1 to 24 hours. Higher temperatures may be used for the mixing or contacting with the proviso that the (C) organic peroxide is not subjected thereto. Thereafter if desired, the admixture may be cooled to a temperature below a peroxide decomposition temperature before being mixed or contacted with (C) organic peroxide. If desired the polyolefin composition may be cooled to a storage temperature (e.g., 23° C.) and stored for a period of time of 1 hour, 1 week, 1 month, or longer.

The polyolefin composition may be prepared as a one-part formulation, alternatively a multi-part formulation such as a two-part formulation, alternatively a three-part formulation. There is no inherent reason why any combination of constituents cannot be included in either part or parts of these formulations.

The one-part formulation comprises constituents (A) and (B), and any optional additives such as constituents (C) and (E), in a single mixture, which is the polyolefin composition.

The two-part formulation may comprise first and second parts, wherein the first part consists essentially of (A) and (B) and, optionally, (D) conventional coagent, (E) antioxidant, and (H) hindered amine stabilizer, and wherein the second part consists essentially of (C) organic peroxide or an additive masterbatch composition containing at least one of constituents (D) to (M), and optionally constituent (A), which may be used as a carrier resin in the additive masterbatch. The constituent(s) (A), (D), and/or (E) in the second part may or may not be the same as the constituent(s) (A), (D), and/or (E) in the first part. The remaining constituents may be in the first part or the second part or both. The polyolefin composition may be made from the two-part formulation by combining the first and second parts, e.g., during extrusion, to give the polyolefin composition as an admixture thereof. Alternatively, the first part may comprise (A), and optionally one or more of (D) to (M), and the second part may comprise (B) and (C) organic peroxide, and optionally one or more of (D), (E) and (H), which may be the same as or different than any (D), (E) and/or (H), respectively, in the first part. Alternatively, the first part may comprise (A), (B), and optionally one or more of constituents (D) to (M), and the second part may comprise (C) organic peroxide, and optionally one or more of constituents (D), (E) and (H), which may be the same as or different than any (D), (E) and/or (H) in the first part. The polyolefin composition may be made from the two-part formulation by injecting a second part into a first part during extrusion to give the polyolefin composition as an admixture thereof.

The three-part formulation may be the same as the two-part formulation except that constituent (C) organic peroxide comprises a third part. When (C) comprises a third part, the polyolefin composition may be made by combining the first and/or second parts to give an admixture thereof; if desired optionally pelletizing the admixture to give the admixture in the form of pellets; and then contacting the admixture (e.g., pellets) of the first and/or second parts with the third part (i.e., (C) organic peroxide) to give the polyolefin composition as an admixture of the first, second and third parts.

The constituent (A) polyolefin polymer: a crosslinkable macromolecule composed of repeat units made from an olefin monomer and optionally one or more olefin-functional comonomers, wherein the macromolecule has a backbone consisting essentially of, or consisting of carbon atoms, or a collection of such crosslinkable macromolecules, which and yield a network structure upon being crosslinked with constituent (B). The (A) may be a homopolymer containing repeat units derived from the same monomer or an interpolymer, also referred to as a copolymer, containing repeat units derived from a monomer and repeat units derived from a comonomer that is different than the monomer. Interpolymer includes bipolymers, terpolymers, etc. In some aspects (A) is free of silicon atoms.

The (A) polyolefin polymer may be a polyethylene homopolymer containing 99 to 100 wt % ethylenic monomeric units. The polyethylene homopolymer may be high density polyethylene (HDPE) homopolymer made by coordination polymerization or a low density polyethylene (LDPE) homopolymer made by radical polymerization.

Alternatively, The (A) polyolefin polymer may be an ethylene/alpha-olefin copolymer containing 50 to <100 wt % ethylenic monomeric units and 50 to 0 wt % ($C_3$-$C_{20}$) alpha-olefin-derived comonomeric units. The ethylene/alpha-olefin copolymer embodiment of (A) ethylene/alpha-olefin copolymer may be a linear low density polyethylene (LLDPE), medium density polyethylene (MDPE), or high density polyethylene (HDPE). Alternatively, the polyolefin polymer may be a low density polyethylene (LDPE). The ethylene/alpha-olefin ("α-olefin") interpolymer having an α-olefin content of at least 1 wt %, at least 5 wt %, at least 10 wt %, at least 15 wt %, at least 20 wt %, or at least 25 wt % based on the entire interpolymer weight. These interpolymers can have an alpha-olefin content of less than 50 wt %, less than 45 wt %, less than 40 wt %, or less than 35 wt % based on the entire interpolymer weight. Illustrative ethylene/α-olefin interpolymers are ethylene/propylene, ethylene/1-butene, ethylene/1-hexene, ethylene/1-octene, ethylene/diene containing from 20 to 1 wt % diene comonomeric units, ethylene/propylene/1-octene, ethylene/propylene/1-butene, ethylene/1-butene/1-octene, ethylene/propylene/diene (EPDM) containing 50 to 100 wt % ethylene monomeric units, 49 to >0 wt % of propylene comonomeric units, and 20 to 1 wt % diene comonomeric units. The diene used to make the diene comonomeric units in the ethylene/diene copolymer or in EPDM independently may be 1,3-butadiene, 1,5-hexadiene, 1,7-octadiene, ethylidene norbornene, dicyclopentadiene, vinyl norbornene, or a combination of any two or more thereof.

The (A) polyolefin polymer may be a poly(($C_3$-$C_{20}$)alpha-olefin) homopolymer containing 99 to 100 wt % ($C_3$-$C_{20}$) alpha-olefin monomeric units or a poly(($C_3$-$C_{20}$)alpha-olefin) copolymer containing 99 to 100 wt % of at least two different ($C_3$-$C_{20}$)alpha-olefin monomeric/comonomeric units.

The ($C_3$-$C_{20}$)alpha-olefin of the ethylene/alpha-olefin copolymer and poly(($C_3$-$C_{20}$)alpha-olefin) polymer aspects of (A) polyolefin polymer may be a compound of formula (I): $H_2C=C(H)-R$ (I), wherein R is a straight chain ($C_1$-$C_{18}$)alkyl group. ($C_1$-$C_{18}$)alkyl group is a monovalent unsubstituted saturated hydrocarbon having from 1 to 18 carbon atoms. Examples of R are methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, and octadecyl. In some embodiments the ($C_3$-$C_{20}$) alpha-olefin is 1-propene, 1-butene, 1-hexene, or 1-octene; alternatively 1-butene, 1-hexene, or 1-octene; alternatively 1-butene or 1-hexene; alternatively 1-butene or 1-octene; alternatively 1-hexene or 1-octene; alternatively 1-butene; alternatively 1-hexene; alternatively 1-octene; alternatively a combination of any two of 1-butene, 1-hexene, and 1-octene. Alternatively, the alpha-olefin may have a cyclic structure such as cyclohexane or cyclopentane, resulting in an α-olefin such as 3-cyclohexyl-1-propene (allyl cyclohexane) and vinyl cyclohexane. The ($C_3$-$C_{20}$)alpha-olefin may be used as a comonomer with ethylene monomer.

Alternatively the (A) polyolefin polymer may be a polypropylene homopolymer containing 99 to 100 wt % propylenic monomeric units; alternatively a propylene/ethylene copolymer containing 50 to <100 wt % propylenic monomeric units and 50 to 0 wt % ethylenic comonomeric units; alternatively a propylene/ethylene/diene (EPDM) copolymer containing 50 to <100 wt % propylenic monomeric units, 49 to >0 wt % of ethylenic units, and 20 to 1 wt % dienic comonomeric units. The diene used to make the dienic comonomeric units may be 1,3-butadiene, 1,5-hexadiene, 1,7-octadiene, ethylidene norbornene, dicyclopentadiene, or vinyl norbornene.

Alternatively, the (A) polyolefin polymer may be an ethylene/vinyl acetate (EVA) polymer comprising 50 to <100 wt % ethylenic monomeric units and 50 to >0 wt % vinyl acetate-derived comonomeric units.

Alternatively, the (A) polyolefin polymer may be the ethylene/alkyl (meth)acrylate (EAA) polymer comprising 50 to <100 wt % ethylenic monomeric units and 50 to >0 wt % alkyl (meth)acrylate-derived comonomeric units. The ethylene/alkyl (meth)acrylate (EAA) polymer may be an ethylene/alkyl acrylate copolymer or an ethylene/alkyl methacrylate copolymer. The EAA copolymer may be selected from methyl acrylate, ethyl acrylate, butyl acrylate, methyl methacrylate, ethyl methacrylate, butyl methacrylate, glycidyl acrylate; and glycidyl methacrylate.

Alternatively, the (A) polyolefin polymer may be an acrylate-terminated oligomer or polymer (not an EAA polymer).

Alternatively, the (A) polyolefin polymer may be the acrylate-terminated oligomer or polymer, which may be an acrylate-terminated olefin oligomer, an acrylate-terminated polyolefin, an acrylate-terminated organosiloxane oligomer, an acrylate-terminated polyorganosiloxane, an acrylate-terminated polyether, an acrylate-terminated polyamide, an acrylate-terminated polyimide, or an acrylate-terminated polyester.

Alternatively, the (A) polyolefin polymer may be an ethylene/maleic anhydride copolymer comprising 50 to <100 wt % ethylene monomeric units and 50 to >0 wt % maleic anhydride comonomeric units.

Alternatively, the (A) polyolefin polymer may be the ethylene/alkenyl silane copolymer comprising from 50 to <100 wt % ethylene monomeric units and from 50 to >0 wt % alkenylsilane comonomeric units. Examples are an ethylene/vinyl triethoxysilane copolymer, an ethylene/vinyl trimethoxysilane copolymer, an ethylene/3-(trimethoxysilyl)propyl acrylate, or ethylene/3-(acryloxy)propyl-methyl-dimethoxysilane.

Alternatively, the (A) polyolefin polymer may be the alkenyl-terminated organosiloxane oligomer, which may be a vinyl-terminated organosiloxane oligomer or allyl-terminated organosiloxane oligomer.

Alternatively, the (A) polyolefin polymer is an ethylene/multi-comonomers copolymer, wherein the multi-comonomers are at least two of $(C_3-C_{20})$alpha-olefin, diene, vinyl acetate, alkyl (meth)acrylate, maleic anhydride, alkenyl silane, and alkenyl-terminated organosiloxane oligomer.

Alternatively, the (A) polyolefin polymer may be free of ethylene (co)monomeric units.

Alternatively, the (A) polyolefin polymer may be a polyolefin having at least one grafted functional group selected from acrylate, methacrylate, and trialkoxysilyl.

The (A) polyolefin polymer may be a blend or combination of two or more of the foregoing polymers and copolymers.

The (A) polyolefin polymer may be a blend of two or more different polyolefin polymers or a reactor product of polymerization reactions with two or more different catalysts. The (A) polyolefin polymer may be made in two or more reactors, such as ELITE™ polymers from The Dow Chemical Company.

The (A) polyolefin polymer may be made by any suitable process, many of which are well-known in the art. Any conventional or hereafter discovered production process for producing polyolefin polymers may be employed for preparing the (A). Typically the production process comprises one or more polymerization reactions. For example, the LDPE may be prepared using a high pressure polymerization process. Alternatively, the LDPE may be prepared using a coordination polymerization process conducted using one or more polymerization catalysts such as Ziegler-Natta, chromium oxide, metallocene, post-metallocene catalysts. Suitable temperatures are from 0° to 250° C., or 30° or 200° C. Suitable pressures are from atmospheric pressure (101 kPa) to 10,000 atmospheres (approximately 1,013 MegaPascals ("MPa")). In most polymerization reactions, the molar ratio of catalyst to polymerizable olefins (monomer/comonomer) employed is from $10^{-12}$:1 to $10^{-1}$:1, or from $10^{-9}$:1 to $10^{-5}$:1.

The amount of the (A) polyolefin polymer in the polyolefin composition may be from 40 to 99.99 wt %, alternatively from 55 to 99.00 wt %, alternatively from 70 to 98 wt %, alternatively from 80 to 97 wt %; all based on the total weight of the polyolefin composition.

The constituent (B) monocyclic organosiloxane of formula (I): a molecule containing a single ring substructure composed of silicon and oxygen atoms disposed in an alternating arrangement; and unsaturated organo groups; and optionally H, saturated or aromatic substituent groups; wherein there are at least two unsaturated organo groups and each of at least two silicon atoms in the ring substructure have at least one unsaturated organo group bonded thereto and wherein after accounting for the unsaturated organo groups and oxygen atoms any remaining valences of the silicon atoms are bonded to the H, saturated or aromatic substituent groups; or collection of such molecules. Constituent (B) may be a monocyclic organosiloxane composed of a 6-membered ring (n=3), an 8-membered ring (n=4), a 10-membered ring (n=5), or a 12-membered ring (n=6). The ring substructure is composed of units of formula (I): $[R^1,R^2SiO_{2/2}]_n$ (I), wherein subscript n, $R^1$ and $R^2$ are as defined earlier. In each $[R^1,R^2SiO_{2/2}]$ unit, its $R^1$ and $R^2$ groups are bonded to its silicon atom. The units may be designated using conventional organosiloxane shorthand notations simply as $D^{R1,R2}$ such that formula (I) becomes $[D^{R1,R2}]_n$. In some aspects $R^1$ and $R^2$ are the same, alternatively different.

In some aspects of the (B) monocyclic organosiloxane of formula (I) $R^1$ is vinyl and $R^2$ is ethyl and (B) is $D^{Vi,Et}$ wherein Vi is vinyl and Et is ethyl; alternatively $R^1$ is allyl and $R^2$ is ethyl and (B) is $D^{Allyl,Et}$; alternatively $R^1$ is butenyl ($H_2C$=$C(H)CH_2CH_2$—) and $R^2$ is ethyl and (B) is $D^{Butenyl,Et}$. In some aspects $R^1$ is vinyl and $R^2$ is vinyl and (B) is $D^{Vi,Vi}$; alternatively $R^1$ is allyl and $R^2$ is allyl and (B) is $D^{Allyl,Allyl}$; alternatively $R^1$ is butenyl ($H_2C$=$C(H)CH_2CH_2$—) and $R^2$ is butenyl and (B) is $D^{Butenyl,Butenyl}$. In some aspects $R^1$ is vinyl and $R^2$ is phenyl and (B) is $D^{Vi,Ph}$ wherein Ph is phenyl; alternatively $R^1$ is allyl and $R^2$ is phenyl and (B) is $D^{Allyl,Ph}$; alternatively $R^1$ is butenyl ($H_2C$=$C(H)CH_2CH_2$—) and $R^2$ is phenyl and (B) is $D^{Butenyl,Ph}$. When $R^2$ is methyl ($CH_3$), the unit may be designated more simply as $D^{R1}$ such that formula (I) becomes $[D^{R1}]_n$. In some aspects $R^1$ is vinyl and $R^2$ is methyl and (B) is $D^{Vi}$; alternatively $R^1$ is allyl and $R^2$ is methyl and (B) is $D^{Allyl}$; alternatively $R^1$ is butenyl ($H_2C$=$C$ (H)CH$_2$CH$_2$—) and R$^2$ is methyl and (B) is D$^{Butenyl}$. In some embodiments, (B) is 2,4,6-trimethyl-2,4,6-trivinyl-cyclotrisiloxane, "(D$^{Vi}$)$_3$" (CAS No. 3901-77-7); 2,4,6,8-tetramethyl-2,4,6,8-tetravinyl-cyclotetrasiloxane, "(D$^{Vi}$)$_4$" (CAS No. 2554-06-5); or a combination thereof.

In some aspects of the (B) monocyclic organosiloxane of formula (I) each R$^1$ is independently H$_2$C═C(R$^{1a}$)—C(═O)—O—(CH$_2$)$_m$— wherein R$^{1a}$ and subscript m are as defined earlier. In some aspects R$^{1a}$ is H, alternatively R$^{1a}$ is methyl. In some aspects subscript m is 1, 2, or 3; alternatively m is 2, 3, or 4; alternatively m is 2 or 3; alternatively m is 1; alternatively m is 2; alternatively m is 3; alternatively m is 4. In some aspects each R$^2$ is independently (C$_1$-C$_2$)alkyl or (C$_2$-C$_3$)alkenyl; alternatively each R$^2$ is independently (C$_1$-C$_2$)alkyl; alternatively each R$^2$ is independently methyl.

The amount of the constituent (B) monocyclic organosiloxane of formula (I) in the polyolefin composition may be from 0.01 to 50 wt %, alternatively from 0.1 to 25 wt %, alternatively from 1.00 to 20 wt %, alternatively from 1.05 to 15 wt %, alternatively from 0.01 to 5 wt %, alternatively from 0.050 to 4.0 wt %, alternatively from 0.10 to 2.0 wt %, alternatively from 0.20 to 1.0 wt %; all based on the total weight of the polyolefin composition.

The amount of the constituent (B) monocyclic organosiloxane of formula (I) in the polyolefin composition may be a crosslinking effective amount. The term "crosslinking effective amount" means a quantity (wt % described above) that is sufficient under the circumstances to enable crosslinking polyolefin macromolecules via multivalent crosslinker groups derived from (B). The circumstances may include loading level (wt %) of (B), loading level (wt %) of (C) organic peroxide in peroxide curing aspects, or the irradiation dosage in irradiation curing aspects. A crosslinking effective amount of (B) monocyclic organosiloxane of formula (I) gives a greater extent of crosslinking, at a particular loading level (wt %) of (C) organic peroxide or at a particular dosage level of irradiation, than a comparative composition that is free of the (B) monocyclic organosiloxane of formula (I). The circumstances may also depend on the total amount, if any, of any optional additive, such as (E) antioxidant, (F) filler and/or (G) flame retardant, present in the polyolefin composition. To determine a crosslinking effective amount for a particular embodiment of the polyolefin composition, the quantity of the (B) monocyclic organosiloxane of formula (I) in the polyolefin composition initially may be less than the crosslinking effective amount. Thereafter, the quantity of (B) is increased by increments (e.g., doubling with each increase) until a crosslinking effect amount under the circumstances is reached.

The crosslinking effective amount of the constituent (B) monocyclic organosiloxane of formula (I) in the polyolefin composition may be from 0.01 to 50 wt %, alternatively from 0.1 to 25 wt %, alternatively from 1.00 to 20 wt %, alternatively from 1.05 to 15 wt %, alternatively from 0.01 to 5 wt %, alternatively from 0.050 to 4.0 wt %, alternatively from 0.10 to 2.0 wt %, alternatively from 0.20 to 1.0 wt %; all based on the total weight of the filler-free polyolefin composition. The crosslinking effective amount of the constituent (B) monocyclic organosiloxane of formula (I) in the polyolefin composition may vary depending upon the circumstances described above. For example, the crosslinking effective amount of (B) may be higher in embodiments of the polyolefin composition that contain (F) filler than in embodiments of the polyolefin composition that are free of (F) filler.

Regarding determining the crosslinking effective amount of the constituent (B), the presence of crosslinking may be detected by an increase in torque using a moving die rheometer (MDR). In some aspects the presence of crosslinking may be detected as a percentage solvent extraction (Ext %). Ext %=W1/Wo*100%, wherein W1 is the weight after extraction, Wo is original weight before extraction, / indicates division, and * indicates multiplication. The absence of, or a reduced level of, the carbon-carbon double bond of the unsaturated organogroup (e.g., R$^1$) of (B) in the crosslinked polyolefin product (due to a coupling with the (A) polyolefin polymer) may be detected by carbon-13 or silicon-29 nuclear magnetic resonance ($^{13}$C-NMR spectroscopy and/or $^{29}$Si-NMR) spectroscopy.

The optional constituent (C) organic peroxide: a molecule containing carbon atoms, hydrogen atoms, and two or more oxygen atoms, and having at least one —O—O— group, with the proviso that when there are more than one —O—O— group, each —O—O— group is bonded indirectly to another —O—O— group via one or more carbon atoms, or collection of such molecules. The (C) organic peroxide may be added to the polyolefin composition if curing of the polyolefin composition is desired, especially curing comprising heating the polyolefin composition comprising constituents (A), (B), and (C) to a temperature at or above the (C) organic peroxide's decomposition temperature. The (C) organic peroxide may be a monoperoxide of formula R$^O$—O—O—R$^O$, wherein each R$^O$ independently is a (C$_1$-C$_{20}$)alkyl group or (C$_6$-C$_{20}$)aryl group. Each (C$_1$-C$_{20}$)alkyl group independently is unsubstituted or substituted with 1 or 2 (C$_6$-C$_{12}$)aryl groups. Each (C$_6$-C$_{20}$)aryl group is unsubstituted or substituted with 1 to 4 (C$_1$-C$_{10}$)alkyl groups. Alternatively, the (C) may be a diperoxide of formula R$^O$—O—O—R—O—O—R$^O$, wherein R is a divalent hydrocarbon group such as a (C$_2$-C$_{10}$)alkylene, (C$_3$-C$_{10}$) cycloalkylene, or phenylene, and each R$^O$ is as defined above. The (C) organic peroxide may be bis(1,1-dimethylethyl) peroxide; bis(1,1-dimethylpropyl) peroxide; 2,5-dimethyl-2,5-bis(1,1-dimethylethylperoxy) hexane; 2,5-dimethyl-2,5-bis(1,1-dimethylethylperoxy) hexyne; 4,4-bis(1,1-dimethylethylperoxy) valeric acid; butyl ester; 1,1-bis(1,1-dimethylethylperoxy)-3,3,5-trimethylcyclohexane; benzoyl peroxide; tert-butyl peroxybenzoate; di-tert-amyl peroxide ("DTAP"); bis(alpha-t-butyl-peroxyisopropyl) benzene ("BIPB"); isopropylcumyl t-butyl peroxide; t-butylcumylperoxide; di-t-butyl peroxide; 2,5-bis(t-butylperoxy)-2,5-dimethylhexane; 2,5-bis(t-butylperoxy)-2,5-dimethylhexyne-3,1,1-bis(t-butylperoxy)-3,3,5-trimethylcyclohexane; isopropylcumyl cumylperoxide; butyl 4,4-di(tert-butylperoxy) valerate; or di(isopropylcumyl) peroxide; or dicumyl peroxide. The (C) organic peroxide may be dicumyl peroxide. In some aspects only a blend of two or more (C) organic peroxides is used, e.g., a 20:80 (wt/wt) blend of t-butyl cumyl peroxide and bis(t-butyl peroxy isopropyl)benzene (e.g., LUPEROX D446B, which is commercially available from Arkema). In some aspects at least one, alternatively each (C) organic peroxide contains one —O—O— group. In some aspects the polyolefin composition and crosslinked polyolefin product is free of (C). When present, the (C) organic peroxide may be 0.01 to 4.5 wt %, alternatively 0.05 to 2 wt %, alternatively 0.10 to 2.0 wt %, alternatively 0.2 to 0.8 wt % of the polyolefin composition.

The optional constituent (D) conventional coagent: a molecule that contains a backbone or ring substructure and one, alternatively two or more propenyl, acrylate, and/or vinyl groups bonded thereto, wherein the substructure is composed of carbon atoms and optionally nitrogen atoms, or a collection of such molecules. The (D) conventional coagent is free of silicon atoms. The (D) conventional coagent may be a propenyl-functional conventional coagent as described by any one of limitations (i) to (v): (i) (D) is 2-allylphenyl allyl ether; 4-isopropenyl-2,6-dimethylphenyl allyl ether; 2,6-dimethyl-4-allylphenyl allyl ether; 2-methoxy-4-allylphenyl allyl ether; 2,2'-diallyl bisphenol A; O,O'-diallyl bisphenol A; or tetramethyl diallylbisphenol A; (ii) (D) is 2,4-diphenyl-4-methyl-1-pentene or 1,3-diisopropenylbenzene; (iii) (D) is triallyl isocyanurate ("TAIC"); triallyl cyanurate ("TAC"); triallyl trimellitate ("TATM"); N,N,N',N',N'',N''-hexaallyl-1,3,5-triazine-2,4,6-triamine ("HATATA"; also known as $N^2,N^2,N^4,N^4,N^6,N^6$-hexaallyl-1,3,5-triazine-2,4,6-triamine); triallyl orthoformate; pentaerythritol triallyl ether; triallyl citrate; or triallyl aconitate; (iv) (D) is a mixture of any two of the propenyl-functional coagents in (i). Alternatively, the (D) may be an acrylate-functional conventional coagent selected from trimethylolpropane triacrylate ("TMPTA"), trimethylolpropane trimethylacrylate ("TMPTMA"), ethoxylated bisphenol A dimethacrylate, 1,6-hexanediol diacrylate, pentaerythritol tetraacrylate, dipentaerythritol pentaacrylate, tris(2-hydroxyethyl) isocyanurate triacrylate, and propoxylated glyceryl triacrylate. Alternatively, the (D) may be a vinyl-functional conventional coagent selected from polybutadiene having at least 50 wt % 1,2-vinyl content and trivinyl cyclohexane ("TVCH"). Alternatively, the (D) may be a conventional coagent described in U.S. Pat. No. 5,346,961 or 4,018,852. Alternatively, the (D) may be a combination or any two or more of the foregoing conventional coagents. In some aspects the polyolefin composition and crosslinked polyolefin product is free of (D). When present, the (D) conventional coagent may be 0.01 to 4.5 wt %, alternatively 0.05 to 2 wt %, alternatively 0.1 to 1 wt %, alternatively 0.2 to 0.5 wt % of the polyolefin composition.

The optional constituent (E) antioxidant: an organic molecule that inhibits oxidation, or a collection of such molecules. The (E) antioxidant functions to provide antioxidizing properties to the polyolefin composition and/or crosslinked polyolefin product. Examples of suitable (E) are bis(4-(1-methyl-1-phenylethyl)phenyl)amine (e.g., NAUGARD 445); 2,2'-methylene-bis(4-methyl-6-t-butylphenol) (e.g., VANOX MBPC); 2,2'-thiobis(2-t-butyl-5-methylphenol (CAS No. 90-66-4; 4,4'-thiobis(2-t-butyl-5-methylphenol) (also known as 4,4'-thiobis(6-tert-butyl-m-cresol), CAS No. 96-69-5, commercially LOWINOX TBM-6); 2,2'-thiobis(6-t-butyl-4-methylphenol (CAS No. 90-66-4, commercially LOWINOX TBP-6); tris[(4-tert-butyl-3-hydroxy-2,6-dimethylphenyl)methyl]-1,3,5-triazine-2,4,6-trione (e.g., CYANOX 1790); pentaerythritol tetrakis(3-(3,5-bis(1,1-dimethylethyl)-4-hydroxyphenyl)propionate (e.g., IRGANOX 1010, CAS Number 6683-19-8); 3,5-bis(1,1-dimethylethyl)-4-hydroxybenzenepropanoic acid 2,2'-thiodiethanediyl ester (e.g., IRGANOX 1035, CAS Number 41484-35-9); distearyl thiodipropionate ("DSTDP"); dilauryl thiodipropionate (e.g., IRGANOX PS 800); stearyl 3-(3,5-di-t-butyl-4-hydroxyphenyl)propionate (e.g., IRGANOX 1076); 2,4-bis(dodecylthiomethyl)-6-methylphenol (IRGANOX 1726); 4,6-bis(octylthiomethyl)-o-cresol (e.g. IRGANOX 1520); and 2',3-bis[[3-[3,5-di-tert-butyl-4-hydroxyphenyl]propionyl]] propionohydrazide (IRGANOX 1024). In some aspects (E) is 4,4'-thiobis(2-t-butyl-5-methylphenol) (also known as 4,4'-thiobis(6-tert-butyl-m-cresol); 2,2'-thiobis(6-t-butyl-4-methylphenol; tris[(4-tert-butyl-3-hydroxy-2,6-dimethylphenyl)methyl]-1,3,5-triazine-2,4,6-trione; distearyl thiodipropionate; or dilauryl thiodipropionate; or a combination of any two or more thereof. The combination may be tris[(4-tert-butyl-3-hydroxy-2,6-dimethylphenyl)methyl]-1,3,5-triazine-2,4,6-trione and distearyl thiodipropionate. In some aspects the polyolefin composition and crosslinked polyolefin product is free of (E). When present, the (E) antioxidant may be from 0.01 to 1.5 wt %, alternatively 0.05 to 1.2 wt %, alternatively 0.1 to 1.0 wt % of the polyolefin composition.

The optional constituent (F) filler: a finely-divided particulate solid or gel that occupies space in, and optionally affects function of, a host material. The (F) filler may be a calcined clay, an organoclays, or a hydrophobized fumed silica such as those commercially available under the CAB-O-SIL trade name from Cabot Corporation. The (F) filler may have flame retarding effects. In some aspects the polyolefin composition and crosslinked polyolefin product is free of (F). When present, the (F) filler may be 1 to 40 wt %, alternatively 2 to 30 wt %, alternatively 5 to 20 wt % of the polyolefin composition.

In regard to (F) filler, in some aspects the polyolefin composition does not contain 20 wt % or more of, alternatively does not contain 15 wt % or more of, alternatively does not contain 10 wt % or more of, alternatively is free of an inorganic filler selected from the group consisting of aluminum oxide, aluminum silicate, calcium silicate, magnesium silicate, silica, titanium dioxide, and mixtures thereof. In some aspects the polyolefin composition does not contain 20 wt % or more of, alternatively does not contain 15 wt % or more of, alternatively does not contain 10 wt % or more of, alternatively is free of any inorganic filler selected from the group consisting of: solids containing Al, solids containing Ca, solids containing Mg, solids containing Si, solids containing Ti, and mixtures thereof. In some aspects the polyolefin composition is free of a silsesquioxane, alternatively any siloxane except constituent (B). In some aspects the polyolefin composition is free of a silsesquioxane and any one of the above-mentioned groups of inorganic fillers. For avoidance of doubt, the term "inorganic filler" does not include carbon black.

The optional constituent (G) flame retardant: a molecule or substance that inhibits combustion, or a collection of such molecules. The (G) may be a halogenated or halogen-free compound. Examples of (G) halogenated (G) flame retardants are organochlorides and organobromides, Examples of the organochlorides are chlorendic acid derivatives and chlorinated paraffins. Examples of the organobromides are decabromodiphenyl ether, decabromodiphenyl ethane, polymeric brominated compounds such as brominated polystyrenes, brominated carbonate oligomers, brominated epoxy oligomers, tetrabromophthalic anhydride, tetrabromobisphenol A and hexabromocyclododecane. Typically, the halogenated (G) flame retardants are used in conjunction with a synergist to enhance their efficiency. The synergist may be antimony trioxide. Examples of the halogen-free (G) flame retardant are inorganic minerals, organic nitrogen intumescent compounds, and phosphorus based intumescent compounds. Examples of the inorganic minerals are aluminum hydroxide and magnesium hydroxide. Examples of the phosphorous-based intumescent compounds are organic phosphonic acids, phosphonates, phosphinates, phosphonites, phosphinites, phosphine oxides, phosphines, phosphites, phosphates, phosphonitrilic chloride, phosphorus ester amides, phosphoric acid amides, phosphonic acid amides, phosphinic acid amides, melamine and melamine derivatives thereof, including melamine polyphosphate, melamine pyrophosphate and melamine cyanurate, and mixtures of two or more of these materials. Examples include phenylbisdodecyl phosphate, phenylbisneopentyl phosphate, phenyl ethylene hydrogen phosphate, phenyl-bis-3,5,5' trimethylhexyl phosphate), ethyldiphenyl phosphate, 2 ethylhexyl di(p-tolyl) phosphate, diphenyl hydrogen phosphate, bis(2-ethyl-hexyl) para-tolylphosphate, tritolyl phosphate, bis(2-ethylhexyl)-phenyl phosphate, tri(nonylphenyl) phosphate, phenylmethyl hydrogen phosphate, di(dodecyl) p-tolyl phosphate, tricresyl phosphate, triphenyl phosphate, triphenyl phosphate, dibutylphenyl phosphate, 2-chloroethyldiphenyl phosphate, p-tolyl bis(2,5,5'-trimethylhexyl) phosphate, 2-ethylhexyldiphenyl phosphate, and diphenyl hydrogen phosphate. Phosphoric acid esters of the type described in U.S. Pat. No. 6,404,971 are examples of phosphorus-based flame retardants. Additional examples include liquid phosphates such as bisphenol A diphosphate (BAPP) (Adeka Palmarole) and/or resorcinol bis(diphenyl phosphate) (Fyroflex RDP) (Supresta, ICI), solid phosphorus such as ammonium polyphosphate (APP), piperazine pyrophosphate and piperazine polyphosphate. Ammonium polyphosphate is often used with flame retardant co-additives, such as melamine derivatives. Also useful is Melafine (DSM) (2,4,6-triamino-1,3,5-triazine; fine grind melamine). In some aspects the polyolefin composition and crosslinked polyolefin product is free of (G). When present, the (G) may be in a concentration of from 0.01 to 70 wt %, alternatively 0.05 to 40 wt %, alternatively 1 to 20 wt % of the polyolefin composition.

The optional constituent (H) hindered amine stabilizer: a molecule that contains a basic nitrogen atom that is bonded to at least one sterically bulky organo group and functions as an inhibitor of degradation or decomposition, or a collection of such molecules. The (H) is a compound that has a sterically hindered amino functional group and inhibits oxidative degradation and can also increase the shelf lives of embodiments of the polyolefin composition that contain (C) organic peroxide. Examples of suitable (H) are butanedioic acid dimethyl ester, polymer with 4-hydroxy-2,2,6,6-tetramethyl-1-piperidine-ethanol (CAS No. 65447-77-0, commercially LOWILITE 62); and N,N'-bisformyl-N,N'-bis(2,2,6,6-tetramethyl-4-piperidinyl)-hexamethylenediamine (CAS No. 124172-53-8, commercially Uvinul 4050 H). In some aspects the polyolefin composition and crosslinked polyolefin product is free of (H). When present, the (H) hindered amine stabilizer may be from 0.001 to 1.5 wt %, alternatively 0.002 to 1.2 wt %, alternatively 0.002 to 1.0 wt %, alternatively 0.005 to 0.5 wt %, alternatively 0.01 to 0.2 wt %, alternatively 0.05 to 0.1 wt % of the polyolefin composition.

The optional constituent (I) tree retardant: a molecule that inhibits water and/or electrical treeing, or a collection of such molecules. The tree retardant may be a water tree retardant or electrical tree retardant. The water tree retardant is a compound that inhibits water treeing, which is a process by which polyolefins degrade when exposed to the combined effects of an electric field and humidity or moisture. The electrical tree retardant, also called a voltage stabilizer, is a compound that inhibits electrical treeing, which is an electrical pre-breakdown process in solid electrical insulation due to partial electrical discharges. Electrical treeing can occur in the absence of water. Water treeing and electrical treeing are problems for electrical cables that contain a coated conductor wherein the coating contains a polyolefin. The (I) may be a poly(ethylene glycol) (PEG). In some aspects the polyolefin composition and crosslinked polyolefin product is free of (I). When present, the (I) tree retardant may be from 0.01 to 1.5 wt %, alternatively 0.05 to 1.2 wt %, alternatively 0.1 to 1.0 wt % of the polyolefin composition.

The optional constituent (J) methyl radical scavenger: a molecule that is reactive with methyl radicals, or a collection of such molecules. The (J) react with methyl radicals in the polyolefin composition or crosslinked polyolefin product. The (J) may be a "TEMPO" derivative of 2,2,6,6-tetramethyl-1-piperidinyl-N-oxyl or a 1,1-diarylethylene. Examples of TEMPO derivatives are 4-acryloxy-2,2,6,6-tetramethyl-1-piperidinyl-N-oxyl (CAS No. 21270-85-9, "acrylate TEMPO"), 4-allyloxy-2,2,6,6-tetramethyl-1-piperidinyl-N-oxyl (CAS No. 217496-13-4, "allyl TEMPO"); bis(2,2,6,6-tetramethyl-1-piperidinyl-N-oxyl) sebacate (CAS No. 2516-92-9, "bis TEMPO")); N,N-bis(acryloyl-4-amino)-2,2,6,6-tetramethyl-1-piperidinyl-N-oxyl (CAS No. 1692896-32-4, "diacrylamide TEMPO"); and N-acryloyl-4-amino-2,2,6,6-tetramethyl-1-piperidinyl-N-oxyl (CAS No. 21270-88-2, "monoacrylamide TEMPO"). Examples of 1,1-diarylethylenes are 1,1-diphenylethylene and alpha-methylstyrene. In some aspects the polyolefin composition and crosslinked polyolefin product is free of (J). When present, the (J) methyl radical scavenger may be from 0.01 to 1.5 wt %, alternatively 0.05 to 1.2 wt %, alternatively 0.1 to 1.0 wt % of the polyolefin composition.

The optional constituent (K) scorch retardant: a molecule that inhibits premature curing, or a collection of such molecules. Examples of a scorch retardant are hindered phenols; semi-hindered phenols; TEMPO; TEMPO derivatives; 1,1-diphenylethylene; 2,4-diphenyl-4-methyl-1-pentene (also known as alpha-methyl styrene dimer or AMSD); and allyl-containing compounds described in U.S. Pat. No. 6,277,925B1, column 2, line 62, to column 3, line 46. In some aspects the polyolefin composition and crosslinked polyolefin product is free of (K). When present, the (K) scorch retardant may be from 0.01 to 1.5 wt %, alternatively 0.05 to 1.2 wt %, alternatively 0.1 to 1.0 wt % of the polyolefin composition.

The optional constituent (L) nucleating agent: an organic or inorganic additive that that enhances the rate of crystallization of a polyolefin polymer. Examples of (L) are calcium carbonate, titanium dioxide, barium sulfate, ultra high-molecular-weight polyethylene, potassium hydrogen phthalate, benzoic acid compounds, sodium benzoate compounds, disodium bicyclo[2.2.1]heptane-2,3-dicarboxylate, zinc monoglycerolate, and 1,2-cyclohexanedicarboxylic acid, calcium salt:zinc stearate. In some aspects the polyolefin composition and crosslinked polyolefin product is free of (L). When present, the (L) may be in a concentration of from 0.01 to 1.5 wt %, alternatively 0.05 to 1.2 wt %, alternatively 0.1 to 1.0 wt % of the polyolefin composition.

The optional constituent (M) carbon black: a finely-divided form of paracrystalline carbon having a high surface area-to-volume ratio, but lower than that of activated carbon. Examples of (M) are furnace carbon black, acetylene carbon black, conductive carbons (e.g., carbon fibers, carbon nanotubes, graphene, graphites, and expanded graphite platelets). In some aspects the polyolefin composition and crosslinked polyolefin product is free of (M). When present, the (M) may be in a concentration of from 0.01 to 40 wt %, alternatively 0.05 to 35 wt %, alternatively 0.1 to 20 wt %, alternatively 0.5 to 10 wt %, alternatively 1 to 5 wt %, of the polyolefin composition.

In addition the polyolefin composition may independently further comprise 0.001 to 50 wt %, alternatively 0.05 to 30 wt %, alternatively 0.1 to 20 wt %, alternatively 0.5 to 10 wt %, alternatively 1 to 5 wt % of each of one or more optional additives selected from a carrier resin, lubricant, processing aid, slip agent, plasticizer, surfactant, extender oil, acid scavenger, and metal deactivator. E.g., the extender oil may be as high as 50 wt % of the polyolefin composition. In some aspects the polyolefin composition and crosslinked polyolefin product is free of any one of the immediately foregoing additives.

The foregoing constituents of the polyolefin composition are not believed to function as ring opening catalysts for cyclic siloxanes therein. If, however, any one or more of the foregoing constituents of the polyolefin composition should unexpectedly be found to function as ring opening catalyst(s) for cyclic siloxanes, such constituent(s) would be excluded from the polyolefin composition.

The crosslinked polyolefin product: a reaction product that contains networked polyolefinic resins that contain C—C bond crosslinks formed during curing (crosslinking) of the polyolefin composition. The networked polyolefinic resins may comprise reaction products of coupling macromolecules of the (A) polyolefin polymer with molecules of the (B) monocyclic organosiloxane of formula (I) to give a network structure containing a multivalent monocyclic organosiloxane crosslinker group that is bonded to two or more macromolecules from the (A) polyolefin polymer via a reaction of the two or more macromolecules of (A) polyolefin polymer with one or more $R^1$ groups of the molecule of (B) monocyclic organosiloxane of formula (I). In some aspects two macromolecules of (A) may be added across the same carbon-carbon double bond of the one $R^1$. For example, when two or more $R^1$ is vinyl and zero, one or more $R^2$ is vinyl, the network structure of the crosslinked polyolefin product may contain two or more multivalent monocyclic organosiloxane crosslinker groups of formula (II): [—$CH_2CH_2(R^2)SiO_{2/2}$](II) and/or formula (III) [$CH_3C$(—)(H),($R^2$)$SiO_{2/2}$] (III) and n-2 or fewer (e.g., n-3) unreacted units, if any, of formula (I), wherein subscript n is as defined for formula (I) and "-" indicates one of the multivalencies. When each $R^2$ is independently H, ($C_1$-$C_4$) alkyl, or phenyl in formula (I), each $R^2$ in formulas (II) and (III) independently is H, ($C_1$-$C_4$)alkyl, or phenyl.

The crosslinked polyolefin product may also contain by-products of curing such as alcohol and ketone by-products of the reaction of the (C) organic peroxide. When the polyolefin composition further contains one or more of any optional additives or constituents such as (E) antioxidant, the crosslinked polyolefin product may also contain the any one or more of the optional additives or constituents such as (E), or one or more reaction products formed therefrom during the curing of the polyolefin composition. The crosslinked polyolefin product may be in a divided solid form or in continuous form. The divided solid form may comprise granules, pellets, powder, or a combination of any two or more thereof. The continuous form may be a molded part (e.g., injection molded part) or an extruded part (e.g., a coated conductor or a cable).

The crosslinked polyolefin product may be free of a ring opening catalyst and/or of siloxane polymer molecules (silicones, prepared by ring-opening polymerization of (B)).

A compound includes all its isotopes and natural abundance and isotopically-enriched forms. The enriched forms may have medical or anti-counterfeiting uses.

In some aspects any compound, composition, formulation, mixture, or reaction product herein may be free of any one of the chemical elements selected from the group consisting of: H, Li, Be, B, C, N, O, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, Hf, Ta, W, Re, Os, Ir, Pt, Au, Hg, Tl, Pb, Bi, lanthanoids, and actinoids; with the proviso that chemical elements required by the compound, composition, formulation, mixture, or reaction product (e.g., C and H required by a polyolefin or C, H, and O required by an alcohol) are not excluded.

The following apply unless indicated otherwise. Alternatively precedes a distinct embodiment. ASTM means the standards organization, ASTM International, West Conshohocken, Pa., USA. IEC means the standards organization, International Electrotechnical Commission, Geneva, Switzerland. ISO means the standards organization, International Organization for Standardization, Geneva, Switzerland. Any comparative example is used for illustration purposes only and shall not be prior art. Free of or lacks means a complete absence of; alternatively not detectable. IUPAC is International Union of Pure and Applied Chemistry (IUPAC Secretariat, Research Triangle Park, N.C., USA). May confers a permitted choice, not an imperative. Operative means functionally capable or effective. Optional(ly) means either is absent (excluded), or alternatively is present (included). PPM are weight based. Properties are measured using a standard test method and conditions for the measuring (e.g., viscosity: 23° C. and 101.3 kPa). Ranges include endpoints, subranges, and whole and/or fractional values subsumed therein, except a range of integers does not include fractional values. Room temperature: 23° C.±1° C. Substituted when referring to a compound means having, in place of hydrogen, one or more substituents, up to and including per substitution.

Density is measured according to ASTM D792-13, Standard Test Methods for Density and Specific Gravity (Relative Density) of Plastics by Displacement, Method B (for testing solid plastics in liquids other than water, e.g., in liquid 2-propanol). Report results in units of grams per cubic centimeter ($g/cm^3$ or g/cc).

Melt index ($I_2$) is measured according to ASTM D1238-04 (190° C., 2.16 kg), Standard Test Method for Melt Flow Rates of Thermoplastics by Extrusion Platometer, using conditions of 190° C./2.16 kilograms (kg), formerly known as "Condition E" and also known as $I_2$. Report results in units of grams eluted per 10 minutes (g/10 min.) or the equivalent in decigrams per 1.0 minute (dg/1 min.). 10.0 dg=1.00 g. The measured $I_2$ is an amount of a polyolefin polymer (e.g., polyethylene) at 190° C. that can be forced through an extrusion rheometer orifice of inner diameter 2.0955 millimeters (0.0825 inch) during 10 minutes when the polymer is subjected to a force of 2.16 kilograms (kg). $I_2$ is inversely proportional to the weight average molecular weight ($M_w$) of the polyolefin polymer, although the inverse proportionality is not necessarily linear. Thus, generally the higher the $M_w$, the lower the $I_2$.

Migration Measurement Test Method. The migration additives could be observed by putting 5 grams (g) pellets into an unused transparent, self-sealing polyethylene bag and pressing the pellets 5 times to see any marks become stamped on the bag. If marks are observed record "yes" and if there are no observed marks record "no". A more quantitative method is to weigh the bag before and after wiping. About 600 to 1200 mg of compounded LDPE pellets were weighed by a Mettler Toledo XP205DR balance having a precision to 0.00 mg to give a pre-wiping weight. The weighed pellets were then wiped by a laboratory cloth ("KimWipe") 5 times (Kimtech Science KimWipes Delicate Task Wipers; 4.4×8.4 in. (11.2×21.3 cm)), each time with a new KimWipe. After 5 times wiping, the sample pellets were weighted again to give a post-wiping weight. The difference between the pre-wiping and post-wiping weights was calculated, and the resulting weight difference was divided by the initial pellets weight and the value expressed as a percentage. Repeat this 3 times and then average the four values. Using this method determine average initial migration after 17 hours. After 3 months repeat the text method to determine average final migration. The averages are reported later in Table 2. The baseline of this migration test is around 200 ppm which is measured on the pure LDPE pellets without any additives.

Scorch Time Test Method. Scorch time or time to scorch (ts1) of a sample "X" is measured by MDR at 140° C. and abbreviated ts1@140° C. Scorch time is measured on an Alpha Technologies Rheometer MDR 2000E according to ISO 6502 as follows. Put 5 to 6 g of test material (pellets) into the MDR 200E instrument. Torque is measured as a function of time from 0 (start) to 120 minutes at 140° C. or from 0 (start) to 20 minutes at 180° C., respectively, and torque curve versus time is plotted. The ts1 is the length of time it takes from the start of the test (0 minute) to observe an increase of 1 deciNewton-meter (dNm) in torque from the minimum value in the torque curve. Use the ts1@140° C. to characterize scorch resistance during melt processing processes (e.g., melt compounding or extrusion). Use MDR at 180° C. to characterize curing potential (MH-ML) and curing speed (T90), as described below.

T90 Crosslinking Time Test Method: ASTM D5289-12, Standard Test Method for Rubber Property—Vulcanization Using Rotorless Cure Meters. Measure torque of a test sample using the following procedure. Heat test sample in a moving die rheometer (MDR) instrument MDR2000 (Alpha Technologies) at 180° C. for 20 minutes while monitoring change in torque. Designate the lowest measured torque value as "ML", expressed in deciNewton-meter (dN-m). As curing or crosslinking progresses, the measured torque value increases, eventually reaching a maximum torque value. Designate the maximum or highest measured torque value as "MH", expressed in dN-m. All other things being equal, the greater the MH torque value, the greater the extent of crosslinking. Determine the T90 crosslinking time as being the number of minutes required to achieve a torque value equal to 90% of the difference MH minus ML (MH-ML), i.e., 90% of the way from ML to MH. The shorter the T90 crosslinking time, i.e., the sooner the torque value gets 90% of the way from ML to MH, the faster the curing rate of the test sample. Conversely, the longer the T90 crosslinking time, i.e., the more time the torque value takes to get 90% of the way from ML to MH, the slower the curing rate of the test sample.

EXAMPLES

Polyolefin Polymer (A1): a low density polyethylene (LDPE) product number DFDA-4850 obtained from The Dow Chemical Company, Midland, Mich., USA, which has a density of 0.92 g/cm$^3$, and a melt index (I$_2$) of 2 g/10 min.

Polyolefin Polymer (A2): a low density polyethylene (LDPE) product number DXM-446, which has a density of 0.92 g/cm$^3$ and a melt index (I2) of 2 g/10 min. and is obtained from The Dow Chemical Company.

Monocyclic organosiloxane (B1): 2,4,6-trimethyl-2,4,6-trivinyl-cyclotrisiloxane, "(D$^{Vi}$)$_3$" (CAS No. 3901-77-7) obtained from Gelest.

Monocyclic organosiloxane (B2): 2,4,6,8-tetramethyl-2,4,6,8-tetravinyl-cyclotetrasiloxane, "(D$^{Vi}$)$_4$" (CAS No. 2554-06-5) obtained from Alfa Aesar.

Organic peroxide (C1): dicumyl peroxide ("DCP") obtained from Fangruida.

Antioxidants (E1) and (E2): a blend of Cyanox 1790 and DSTDP. Cyanox 1790 is available from Cytec Industries Inc. and DSTDP is available from Reagens, Inc.

Hindered Amine Stabilizer (H1): Uvinul 4050 from BASF.

Octavinyl polyhedral oligomeric silsesquioxane (OV—POSS): To a 500 mL three-necked flask was added anhydrous methanol (200 mL), deionized water (9 mL), and concentrated hydrochloric acid (36 wt %, 2 mL). The resulting first mixture was stirred at 40° C. for about 10 minutes. To the first mixture was then added dropwise over 4 hours a solution of vinyltrimethoxysilane (20 mL, H$_2$C=C(H)Si(OCH$_3$)$_3$) in methanol (50 mL). An additional portion of methanol (30 mL) was added all at once after the addition of the vinyltrimethoxysilane solution was completed. The resulting combined mixture was stirred for 5 days at 40° C. A precipitate of OV—POSS formed and was filtered off. The resulting filtercake was dissolved in a minimum amount of tetrahydrofuran, and to the resulting solution was added ethanol to reprecipitate the OV—POSS. The reprecipitated OV—POSS was filtered and dried under reduced pressure to give 1 g (11% yield) of OV—POSS as a white solid.

Vinyl methoxysiloxane Homopolymer (VMSH): is an oligomer of formula H$_2$C=C(H)Si(OCH$_3$)$_2$O—[Si(OCH$_3$)(C(H)=CH$_2$)]$_p$—Si(OCH$_3$)$_2$C(H)=CH$_2$, wherein subscript p is a number such that the VMSH has 22 to 23 wt % vinyl content. Obtained as VMM-010 (CAS No. 131298-48-1) from Gelest Inc., Morrisville, Pa., USA.

Vinyl, methylsiloxane homopolymer ("VMS-T11") is an oligomer of formula (CH$_3$)$_3$Si—[Si(CH$_3$)(C(H)=CH$_2$)]$_q$—Si(CH$_3$)$_3$, wherein subscript q is a number such that VMS-T11 has a molecular weight from 1000 to 1500 g/mol. Obtained as VMS-T11 (CAS No. 68037-87-6) from Gelest Inc.

Preparation 1: preparation of a LDPE (A1)/LDPE (A2)/AO (E1)/AO (E2)/Stabilizer (H1) Blend. Mix antioxidants (AO) (E1) and (E2), and the hindered amine stabilizer (H1) together to give a Preblend. Blend the Preblend with polyolefin polymer (A1) to give a first blend containing 0.37 wt % of the Preblend and 99.63 wt % of (A1). Blend the first blend with the polyolefin polymer (A2) to a second blend containing 0.15 wt % of the Preblend with 99.85 wt % of polyolefin polymers (A1) and (A2) to give the Blend of Preparation 1 in bulk form. Pelletize the bulk form of the Blend to give the LDPE (A1)/LDPE (A2)/AO (E1)/AO (E2)/Stabilizer (H1) Blend of Preparation 1 in pellets form.

Comparative Examples 1 and 3 (CE1 & CE3): in separate runs VMSH and organic peroxide (C1) together or VMS-T11 and organic peroxide (C1) together were soaked into the LDPE (A1)/LDPE (A2)/AO (E1)/AO (E2)/Stabilizer (H1) Blend of Preparation 1 at 80° C. for 6 hours to give comparative polyolefin compositions CE1 and CE3, respectively. The compositions are reported later in Table 1.

Comparative Example 2 (CE2): OV—POSS was added into a melt of the LDPE (A1)/LDPE (A2)/AO (E1)/AO (E2)/Stabilizer (H1) Blend of Preparation 1 at 120° C. for 5 minutes at 40 rotations per minute (rpm) in a Brabender internal mixer to give an intermediate composition, which was then pressed at 120° C. for 2 minutes to form a plaque. The plaque was cut into pellets, and the pellets were soaked with organic peroxide (C1) for 6 hours to give comparative polyolefin composition CE2. The composition is reported later in Table 1.

Inventive Examples 1 and 2 (IE1 & IE2): soak Monocyclic organosiloxane (B1) or Monocyclic organosiloxane (B2), respectively, and organic peroxide (C1) into pellets of Preparation 1 at 80° C. for 6 hours in an oven to give polyolefin compositions IE1 and IE2, respectively, in pellets form. The compositions are reported below in Table 1.

TABLE 1 compositions of CE1, CE2, CE3, IE1 and IE2.

| Constituent (weight parts) | CE1 | CE2 | CE3 | IE1 | IE2 |
|---|---|---|---|---|---|
| LDPE-AO/S Blend (Prep. 1) | 98.1 | 98.4 | 98.4 | 98.3 | 98.3 |
| Dicumyl Peroxide (C1) | 0.5 | 0.5 | 0.5 | 0.5 | 0.5 |
| VMSH | 1.4 | 0 | 0 | 0 | 0 |
| VMS-T11 | 0 | 0 | 1.1 | 0 | 0 |
| OV-POSS | 0 | 1.1 | 0 | 0 | 0 |
| (B1) = $(D^{Vi})_3$ | 0 | 0 | 0 | 1.2 | 0 |
| (B2) = $(D^{Vi})_4$ | 0 | 0 | 0 | 0 | 1.2 |
| Total | 100.0 | 100.0 | 100.0 | 100.0 | 100.0 |
| Vinyl content (mmol) | 13.7 | 13.9 | 13.7 | 13.9 | 13.9 |

Characterize test samples of the pellets of the compositions of CE1, CE2, CE3, IE1 and IE2 according to the T90 Crosslinking Time Test Method, Scorch Time Test Method, and Migration Measurement Test Method. The results are reported below in Table 2.

TABLE 2

Characterizations of CE1, CE2, CE3, IE1 and IE2.

| Characterization | CE1 | CE2 | CE3 | IE1 | IE2 |
|---|---|---|---|---|---|
| Lowest Torque ML at 180° C. (dN-m) | 0.19 | 0.22 | 0.19 | 0.18 | 0.18 |
| Highest Torque MH at 180° C. (dN-m) | 1.87 | 3.56 | 2.18 | 3.52 | 2.95 |
| T90 Crosslinking Time (min.) | 4.69 | 4.64 | 4.67 | 4.27 | 4.39 |
| Scorch Time ts1 at 140° C. (min.) | 73.3 | 26.0 | 68.7 | 55.3 | 60.4 |
| Was Surface Migration Observed?* | Yes | No | Yes | No | No |
| Average Initial migration (ppm)* | 4087 | None | 4227 | None | None |
| Average final migration (ppm)** | 7015 | 594 | 4770 | 135 | 93 |

*Initial Migration is determined after 17 hours;
**Final migration was determined after 3 months, both by Migration Measurement Test Method;
ppm = parts per million (weight/weight).

As indicated by the MH torque values in deciNewton-meter in Table 2, the inventive polyolefin composition examples IE1 and IE2 cured to give a crosslinked polyolefin product that beneficially had greater extent of crosslinking than that made from Comparative Example CE1 and CE3. Thus, the (B) monocyclic organosiloxane of formula (I) (e.g., (B1)=$(D^{Vi})_3$ and (B2)=$(D^{Vi})_4$)) functions more effectively as a silicon-based coagent for enhancing crosslinking of polyolefins than does the vinyl methoxysiloxane homopolymer VMSH.

As indicated by the T90 crosslinking times in minutes in Table 2, the inventive polyolefin compositions of examples IE1 and IE2 beneficially had shorter T90 crosslinking times than the compositions of Comparative Examples CE1, CE2 and CE3. Thus, the monocyclic organosiloxane of formula (I) (e.g., (B1)=$(D^{Vi})_3$ and (B2)=$(D^{Vi})_4$)) enables faster curing of (A) polyolefin polymers than does the vinyl methoxysiloxane homopolymer VMSH or the cage-like OV—POSS.

As indicated by the Scorch Times ts1 at 140° C. in minutes in Table 2, the inventive polyolefin compositions of examples IE1 and IE2 beneficially had longer times to scorch than the comparative composition of Comparative Example CE2. Thus, the polyolefin compositions with the (B) monocyclic organosiloxane of formula (I) (e.g., (B1)=$(D^{Vi})_3$ and (B2)=$(D^{Vi})_4$)) exhibit greater resistance to premature curing than does the comparative polyolefin composition with the cage-like OV—POSS.

As indicated by the surface migration observation results in Table 2, the inventive compositions of examples IE1 and IE2 beneficially resisted migration of the (B) monocyclic organosiloxane of formula (I) (e.g., (B1)=$(D^{Vi})_3$ and (B2)=$(D^{Vi})_4$)) to surfaces of its pellets.

Inventive Examples 3 and 4 (IE3 & IE4): Fourier Transform-Infrared (FT-IR) Spectroscopy characterization of inventive crosslinked polyolefin products. For IE3, combined Polyolefin Polymer (A1) (LDPE) and Monocyclic organosiloxane (B2) to give an inventive polyolefin composition of IE3. Irradiated the polyolefin composition of IE3 to give the crosslinked polyolefin product of IE3. For IE4, combined a LDPE (A1), Monocyclic organosiloxane (B2), organic peroxide (C1), and blend of Antioxidants (E1) and (E2 to give an inventive polyolefin composition of IE4. Cured the composition of IE4 at 180° C. for 30 minutes to give inventive crosslinked polyolefin product of IE4. FT-IR spectra obtained on crosslinked polyolefin products IE3 and IE4 did not show a shoulder or peak at 1110 cm$^{-1}$ or 1010 cm$^{-1}$, indicating no ring opening of Monocyclic organosiloxane (B2) in the crosslinked polyolefin products of IE3 or IE4.

Incorporate by reference here the below claims as numbered aspects except replace "claim" and "claims" by "aspect" or "aspects," respectively.

The invention claimed is:

1. A polyolefin composition comprising (A) a polyolefin polymer and a crosslinking effective amount of (B) a monocyclic organosiloxane of formula (I): $[R^1,R^2SiO_{2/2}]_n$ (I), wherein subscript n is 3, 5, or 6; each $R^1$ is independently a $(C_2-C_4)$alkenyl or a $H_2C=C(R^{1a})$—$C(=O)$—$O$—$(CH_2)_m$- wherein $R^{1a}$ is H or methyl and subscript m is an integer from 1 to 4; and each $R^2$ is independently H, $(C_1-C_4)$alkyl, phenyl, or $R^1$; and wherein the (B) monocyclic organosiloxane of formula (I) is described by any one of limitations (i) to (viii): (i) each $R^1$ is independently a $(C_2-C_3)$alkenyl; and each $R^2$ is independently H, $(C_1-C_2)$alkyl, or $(C_2-C_3)$alkenyl; (ii) each $R^1$ is vinyl; and each $R^2$ is independently $(C_1-C_2)$alkyl; (iii) each $R^1$ is vinyl; and each $R^2$ is methyl; (iv) each $R^1$ is allyl; and each $R^2$ is independently $(C_1-C_2)$alkyl; (v) each $R^1$ is allyl; and each $R^2$ is methyl; (vi) each $R^1$ is independently $H_2C=C(R^{1a})$—$C(=O)$—$O$—$(CH_2)_m$- wherein $R^{1a}$ is H or methyl and subscript m is an integer from 1 to 4; and each $R^2$ is independently H, $(C_1-C_2)$alkyl, or $(C_2-C_3)$alkenyl; (vii) each $R^1$ is independently $H_2C=C(R^{1a})$—$C(=O)$—$O$—$(CH_2)_m$- wherein $R^{1a}$ is H and subscript m is 3; and each $R^2$ is independently $(C_1-C_2)$alkyl; and (viii) each $R^1$ is independently $H_2C=C(R^{1a})$—$C(=O)$—$O$—$(CH_2)_m$- wherein $R^{1a}$ is methyl and subscript m is 3; and each $R^2$ is independently $(C_1-C_2)$alkyl;

with the proviso that the polyolefin composition is free of a phosphazene base; and with the proviso that the polyolefin composition is free of an inorganic filler selected from the group consisting of solids containing Al, solids containing Ca, solids containing Mg, solids containing Si, solids containing Ti, and mixtures thereof; and with the proviso that the polyolefin composition is free of a (G) flame retardant comprising an inorganic mineral.

2. The polyolefin composition of claim 1 wherein subscript n is 3.

3. The polyolefin composition of claim 1 wherein subscript n is 5 or 6.

4. The polyolefin composition of claim 1 wherein the (A) polyolefin polymer is described by any one of limitations (i) to (ix): (i) the (A) polyolefin polymer is a polyethylene polymer comprising 50 to 100 weight percent (wt %) ethylenic monomeric units, 50 to 0 wt % $(C_3-C_{20})$alpha-olefin-derived comonomeric units, and 20 to 0 wt % diene comonomeric units, wherein total weight percent is 100.00 wt %; (ii) the (A) polyolefin polymer is a polypropylene polymer comprising 50 to 100 weight percent (wt %) propylenic monomeric units and 50 to 0 wt % of ethylenic or $(C_4-C_{20})$alpha-olefin-derived comonomeric units and optionally 20 to 0 wt % dienic comonomeric units; (iii) the (A) polyolefin polymer is an ethylene/vinyl acetate (EVA) copolymer comprising 50 to <100 wt % ethylenic monomeric units and 50 to >0 wt % vinyl acetate-derived comonomeric units; (iv) the (A) polyolefin polymer is an ethylene/alkyl (meth)acrylate (EAA) copolymer comprising 50 to <100 wt % ethylenic monomeric units and 50 to >0 wt % alkyl (meth)acrylate-derived comonomeric units; (v) the (A) polyolefin polymer is an acrylate-terminated oligomer or polymer (not an EAA polymer); (v) the (A) polyolefin polymer is free of ethylenic units; (vi) the (A) polyolefin polymer is an ethylene/maleic anhydride copolymer comprising 50 to <100 wt % ethylene monomeric units and 50 to >0 wt % maleic anhydride comonomeric units; (vii) the (A) polyolefin polymer is an ethylene/alkenyl silane copolymer comprising from 50 to <100 wt % ethylene monomeric units and from 50 to >0 wt % alkenylsilane comonomeric units; (viii) the (A) polyolefin polymer is an ethylene/multi-comonomers copolymer, the multi-comonomers are at least two of $(C_3-C_{20})$alpha-olefin, diene, vinyl acetate, alkyl (meth)acrylate, maleic anhydride, alkenyl silane, and alkenyl-terminated organosiloxane oligomer; and (ix) the (A) polyolefin polymer is a combination or blend of any two of (i) to (viii).

5. The polyolefin composition of claim 4 wherein the $(C_3-C_{20})$alpha-olefin-derived comonomeric units and/or $(C_4-C_{20})$alpha-olefin-derived comonomeric units are derived from 1-butene, 1-hexene, 1-octene, or a combination of any two thereof.

6. The polyolefin composition of claim 1 further comprising at least one additive selected from the group consisting of: (C) an organic peroxide; (D) a conventional coagent; (E) an antioxidant; (H) a hindered amine stabilizer; (I) a tree retardant; (J) a methyl radical scavenger; (K) a scorch retardant, (L) a nucleating agent, and (M) carbon black; with the proviso that the total amount of the at least one additive is from >0 to 70 wt % of the polyolefin composition;

and with the proviso that the polyolefin composition is free of any (F) filler and any (G) flame retardant.

7. A method of making a polyolefin composition, the method comprising mixing (A) a polyolefin polymer and crosslinking effective amount of (B) a monocyclic organosiloxane of formula (I): $[R^1,R^2SiO_{2/2}]_n$ (I) together to make the polyolefin composition of claim 1.

8. A manufactured article comprising a shaped form of the polyolefin composition of claim 1.

9. A method of free-radical curing a polyolefin composition comprising (A) a polyolefin polymer and a crosslinking effective amount of a (B) a monocyclic organosiloxane of formula (I): $[R^1,R^2SiO_{2/2}]_n$ (I), wherein subscript n is 3, 5, or 6; each $R^1$ is independently a $(C_2-C_4)$alkenyl; and each $R^2$ is independently H, $(C_1-C_4)$alkyl, $(C_2-C_4)$alkenyl, or phenyl to make a crosslinked polyolefin product, the method comprising irradiating the polyolefin composition with a curing effective dose of irradiation and/or heating the polyolefin composition at a curing effective temperature with (C) an organic peroxide so as to react the (A) polyolefin polymer with the (B) monocyclic organosiloxane of formula (I), thereby making a crosslinked polyolefin product.

10. A crosslinked polyolefin product made by the method of curing of claim 9.

* * * * *